US011740612B2

(12) United States Patent
Pathan et al.

(10) Patent No.: US 11,740,612 B2
(45) Date of Patent: Aug. 29, 2023

(54) MULTISCALE MATERIAL SELECTION METHOD FOR DESIGNING MECHANICAL SYSTEMS

(71) Applicant: Tata Consultancy Services Limited, Mumbai (IN)

(72) Inventors: Rizwan Khan Pathan, Pune (IN); Soban Babu Beemaraj, Pune (IN); Amit Gangadhar Salvi, Pune (IN)

(73) Assignee: TATA CONSULTANCY SERVICES LIMITED, Mumbai (IN)

(*) Notice: Subject to any disclaimer, the term of this patent is extended or adjusted under 35 U.S.C. 154(b) by 481 days.

(21) Appl. No.: 16/997,763

(22) Filed: Aug. 19, 2020

(65) Prior Publication Data

US 2021/0181721 A1 Jun. 17, 2021

(30) Foreign Application Priority Data

Aug. 16, 2019 (IN) .............................. 201921033171

(51) Int. Cl.
*G05B 19/418* (2006.01)
*G06F 16/9035* (2019.01)
*G06F 30/17* (2020.01)

(52) U.S. Cl.
CPC ... *G05B 19/4183* (2013.01); *G05B 19/41805* (2013.01); *G05B 19/41865* (2013.01); *G06F 16/9035* (2019.01); *G06F 30/17* (2020.01)

(58) Field of Classification Search
CPC ...... G06F 30/00; G06F 16/9035; G06F 30/17; G06F 30/20; G05B 19/4183; G05B 19/41805; G05B 19/41865

USPC ......................................................... 703/7, 6
See application file for complete search history.

(56) References Cited

U.S. PATENT DOCUMENTS

2009/0082892 A1* 3/2009 Tang .................... B29C 70/386
700/103

OTHER PUBLICATIONS

Okereke M.I. et al., "Virtual Testing of Advanced Composites, Cellular Materials and Biomaterials: A Review", Jan. 9, 2014, Composites: Part B 60, Elsevier Ltd. (Year: 2014).*
Chatys, Ratal et al., "Composite Materials Having a Layer Structure of "Sandwich" Construction as Above Used in Car Safety Bumps", Jun. 7, 2018, XI International Science-Technical Conference Automotive Safety, IEEE. (Year: 2018).*

(Continued)

*Primary Examiner* — Cedric Johnson
(74) *Attorney, Agent, or Firm* — Finnegan, Henderson, Farabow, Garrett & Dunner LLP

(57) ABSTRACT

Conventionally material selection of composite structure is performed by using discrete materials available in manufacturer's databases. Thus, tailorable nature of composite materials is not exploited to achieve superior performance. Further, conventional methods perform material selection and sizing separately and do not take into account the influence of sizing on material selection and vice versa. Embodiments of the present disclosure provide systems and methods for multiscale material selection for designing of mechanical systems that incorporates tailoring of material microstructures and sizing to achieve improved solutions. The microstructure properties are obtained by using analytical and computational models for various composite materials. These models compute structure-property relations between bulk material properties and their micro-structural constituents.

18 Claims, 10 Drawing Sheets

(56) References Cited

OTHER PUBLICATIONS

McKnight G. et al., "Large Strain Variable Stiffness Composites for Shear Deformations with Applications to Morphing Aircraft Skins", 2008, Behavior and Mechanics of Multifunctional and Composite Materials, Proc. of SPIE. (Year: 2008).*

Ahmed, Naveed et al., "Homogenization of Honeycomb Core in Sandwich Structures: A Review", Jan. 8-12, 2019, Proceedings of 2019 16th International Bhurban Conference on Applied Sciences & Technology (IBCAST), IEEE. (Year: 2019).*

Zinno, A. et al..; "Multiscale approach for the design of composite sandwich structures fortrain application"; Composite Structures; Aug. 2010; Research Gate; https://kundoc.com/pdf-multiscale-approach-for-the-design-of-composite-sandwich-structures-for-train-ap.html.

Tang, Xingang et al.; Shape, sizing optimization and material selection based on mixed variables and genetic algorithm:; Optimization and Engineering; Mar. 2011; Research Gate; https://core.ac.uk/download/pdf/81765411.pdf.

Kanouté, Arthur P. et al.; "Multiscale Methods for Composites: A Review"; Computational Methods in Engineering; Mar. 2009; vol. 16; pp. 31-75; Research Gate; https://www.researchgate.net/publication/225981515_Multiscale_Methods_for_Composites_A_Review/link/5436642e0cf2643ab986cd65/download.

Belouettar, Salim et al..; "Integration of material and process modelling in a business decision support system: Case of COMPOSELECTOR H2020 project"; Composite Structures; Nov. 2018; vol. 204; pp. 778-790; Elsevier; https://core.ac.uk/download/pdf/81765411.pdf.

* cited by examiner

MULTISCALE MATERIAL SELECTION METHOD FOR DESIGNING MECHANICAL SYSTEMS

PRIORITY CLAIM

This U.S. patent application claims priority under 35 U.S.C. § 119 to: India Application No. 201921033171, filed on Aug. 16, 2019. The entire contents of the aforementioned application are incorporated herein by reference.

TECHNICAL FIELD

The disclosure herein generally relates to composite material designing techniques, and, more particularly, to multiscale material selection method for designing mechanical systems.

BACKGROUND

Composite materials are increasingly being used in load bearing structures due to their high specific stiffness and strength. Designing composite structures involve solving multiple conflicting objectives (e.g., weight and deflection) and constraints (e.g., failure stress and strain), which is a challenging task. Currently material selection of composite structure is performed by using discrete materials available in manufacturer's databases. Thus, tailorable nature of composite materials has not been exploited to achieve superior performance. Further, conventional methods perform material selection and sizing separately. Thus, the methods do not take into account the influence of sizing on material selection and vice versa. The solution achieved by such methods may not be the best combination of material plus sizing for a given application. Since the material selection happens first and are qualified at a later stage, this may leave out some suitable material combinations and can lead to building low standard mechanical structures.

SUMMARY

Embodiments of the present disclosure present technological improvements as solutions to one or more of the above-mentioned technical problems recognized by the inventors in conventional systems. For example, in one aspect, there is provided a processor implemented method for multiscale material selection for designing mechanical systems. The method comprises receiving, via one or more hardware processors, an input comprising at least one of the mechanical system problem, a structural design problem, a dynamic problem and a vibrational problem; computing, via the one or more hardware processors, a set of unique material properties for the input that satisfies one or more problem requirements; obtaining, via the one or more hardware processors, a range of values specific to the set of unique material properties and a plurality of sizing parameters corresponding to a plurality of physical materials for the input; selecting, via the one or more hardware processors, at least a subset of (i) the set of unique material properties and (ii) the plurality of sizing parameters of the physical materials that satisfies the problem requirement using a selection technique; determining (i) one or more functional properties and (ii) one or more non-functional properties of the one or more physical materials based on structure property relationships, wherein the structure property relationships are determined based on one or more analytical and computational models for various composite materials; and identifying for the input, one or more microstructures as one or more optimal microstructures amongst a plurality of microstructures based on the at least of subset of (i) the set of unique material properties and (ii) the plurality of sizing parameters of the physical materials, and the one or more functional properties and the one or more non-functional properties that satisfy the one or more problem requirements.

In an embodiment, the range of values specific to the one or more properties are obtained based on a calculation of minimum and maximum values of the set of unique material properties and by using one or more structure property models.

In an embodiment, the selection technique is a Decision-Making Algorithm (DMA).

In an embodiment, the one or more microstructures are obtained and identified as the optimal microstructure when a value of the one or more functional properties and the one or more non-functional properties of one or more components and sub-components of a physical material from the plurality of physical materials is less than or equal to a pre-defined threshold for the input.

In another embodiment, the one or more microstructures are obtained and identified as the optimal microstructure when a value of the one or more functional properties and the one or more non-functional properties of one or more components and sub-components of a physical material from the plurality of physical materials is greater than or equal to a pre-defined threshold for the input.

In yet another embodiment, the one or more microstructures are obtained and identified as the optimal microstructure when a value of the one or more functional properties and the one or more non-functional properties of one or more components and sub-components of a physical material from the plurality of physical materials are between a first pre-defined threshold and a second pre-defined threshold for the input.

In another aspect, there is provided a system for multiscale material selection for design mechanical systems. The system comprises a memory storing instructions; one or more communication interfaces; and one or more hardware processors coupled to the memory via the one or more communication interfaces, wherein the one or more hardware processors are configured by the instructions to: receive an input comprising at least one of the mechanical system problem, a structural design problem, a dynamic problem and a vibrational problem; compute a set of unique material properties for the input that satisfies one or more problem requirements; obtain a range of values specific to the set of unique material properties such as shear and elastic moduli and Poisson's ratio, tensile, compressive and shear strengths, thermal and electrical conductivity, thermal coefficient of expansion and density and a plurality of sizing parameters corresponding to a plurality of physical materials for the input; select at least a subset of (i) the set of unique material properties and (ii) the plurality of sizing parameters of the physical materials that satisfies the problem requirement using a selection technique; determine (i) one or more functional properties and (ii) one or more non-functional properties of the one or more physical materials based on structure property relationships, wherein the structure property relationships are determined based on one or more analytical and computational models for various composite materials; and identify for the input, one or more microstructures as one or more optimal microstructures amongst a plurality of microstructures based on the at least of subset of (i) the set of unique material properties and (ii) the plurality of sizing parameters of the physical materials, and the one or more functional properties and the one or more non-functional properties that satisfy the one or more problem requirements.

In an embodiment, the range of values specific to the one or more properties are obtained based on a calculation of minimum and maximum values of the set of unique material properties and by using one or more structure property models.

In an embodiment, the selection technique is a Decision-Making Algorithm (DMA).

In an embodiment, the one or more microstructures are obtained and identified as the optimal microstructure when a value of the one or more functional properties and the one or more non-functional properties of one or more components and sub-components of a physical material from the plurality of physical materials is less than or equal to a pre-defined threshold for the input.

In another embodiment, the one or more microstructures are obtained and identified as the optimal microstructure when a value of the one or more functional properties and the one or more non-functional properties of one or more components and sub-components of a physical material from the plurality of physical materials is greater than or equal to a pre-defined threshold for the input.

In yet another embodiment, the one or more microstructures are obtained and identified as the optimal microstructure when a value of the one or more functional properties and the one or more non-functional properties of one or more components and sub-components of a physical material from the plurality of physical materials are between a first pre-defined threshold and a second pre-defined threshold for the input.

In yet another aspect, there are provided one or more non-transitory machine readable information storage mediums comprising one or more instructions which when executed by one or more hardware processors cause multiscale material selection for designing mechanical systems by receiving, via the one or more hardware processors, an input comprising at least one of the mechanical system problem, a structural design problem, a dynamic problem and a vibrational problem; computing, via the one or more hardware processors, a set of unique material properties for the input that satisfies one or more problem requirements; obtaining, via the one or more hardware processors, a range of values specific to the set of unique material properties and a plurality of sizing parameters corresponding to a plurality of physical materials for the input; selecting, via the one or more hardware processors, at least a subset of (i) the set of unique material properties and (ii) the plurality of sizing parameters of the physical materials that satisfies the problem requirement using a selection technique; determining (i) one or more functional properties and (ii) one or more non-functional properties of the one or more physical materials based on structure property relationships, wherein the structure property relationships are determined based on one or more analytical and computational models for various composite materials; and identifying for the input, one or more microstructures as one or more optimal microstructures amongst a plurality of microstructures based on the at least of subset of (i) the set of unique material properties and (ii) the plurality of sizing parameters of the physical materials, and the one or more functional properties and the one or more non-functional properties that satisfy the one or more problem requirements.

In an embodiment, the range of values specific to the one or more properties are obtained based on a calculation of minimum and maximum values of the set of unique material properties and by using one or more structure property models.

In an embodiment, the selection technique is a Decision-Making Algorithm (DMA).

In an embodiment, the one or more microstructures are obtained and identified as the optimal microstructure when a value of the one or more functional properties and the one or more non-functional properties of one or more components and sub-components of a physical material from the plurality of physical materials is less than or equal to a pre-defined threshold for the input.

In another embodiment, the one or more microstructures are obtained and identified as the optimal microstructure when a value of the one or more functional properties and the one or more non-functional properties of one or more components and sub-components of a physical material from the plurality of physical materials is greater than or equal to a pre-defined threshold for the input.

In yet another embodiment, the one or more microstructures are obtained and identified as the optimal microstructure when a value of the one or more functional properties and the one or more non-functional properties of one or more components and sub-components of a physical material from the plurality of physical materials are between a first pre-defined threshold and a second pre-defined threshold for the input.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Figure 1:
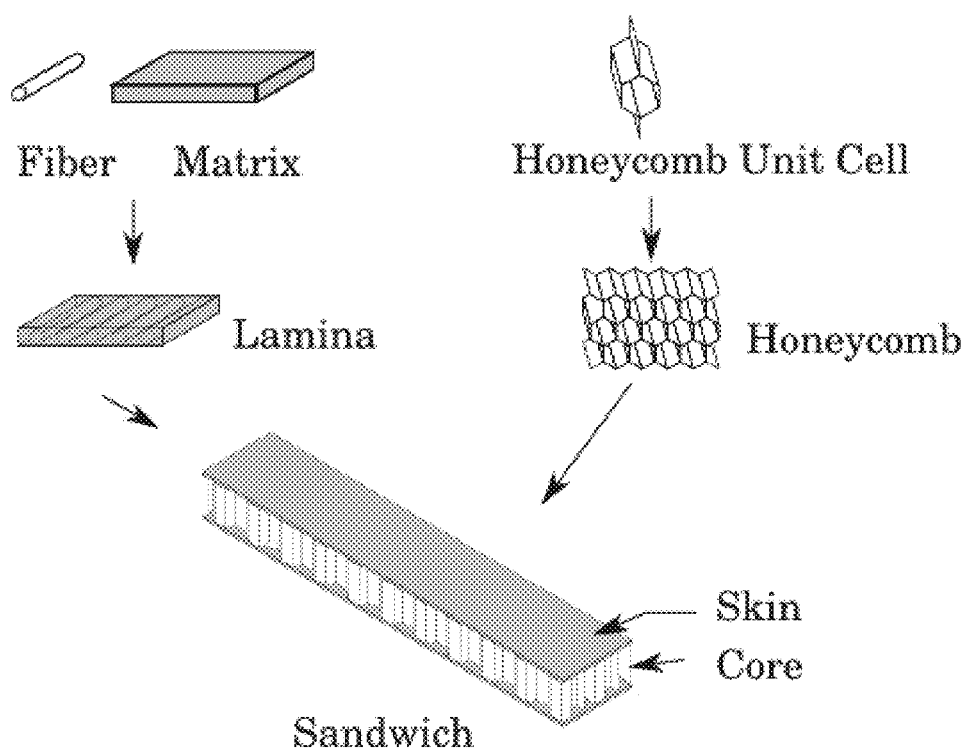
FIG. 1 depicts multiscale nature of sandwich composite panel.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Designers worldwide are using composite materials to maximize the performance of the products. These materials fulfill functional (e.g. mechanical, physical properties) as well as nonfunctional (e.g., chemical, biological, environmental properties) requirements of the products. Composite materials are combination of two or more materials combined using various manufacturing techniques to yield superior performance. These large number of material alternatives and multiple manufacturing processes coupled with the complex relationships among the different selection parameters often make, material selection and sizing of composites a difficult task. Thus, designers need decision making techniques to assist them to take design decisions in case of multiple objectives and conflicting requirements. In the preliminary design stage, material selection is carried out for multiple load cases, boundary conditions and design requirements for a given structure. Once the material is selected, topology optimization and sizing is performed to arrive at the final configuration. There have been several attempts to standardize material selection processes. Conventionally researchers (e.g., Chiner et al. Planning of expert systems for materials selection. Materials & Design, 9(4):195-203, 1988) performed material selection in following stages,
1. Definition of design.
2. Analysis of material properties.
3. Screening of candidate materials, evaluation and decision for optimal solution.

Farag et al. (Quantitative methods of materials selection. Handbook of materials selection, pages 1-24, 2002) describes different stages of design and the related activities of the material selection namely initial screening, developing and comparing alternatives, and selecting the optimum solution. Among other methods, material selection technique (e.g., refer (Materials Selection in Mechanical Design. Butterworth-Heinemann, 2011 by Michael F. Ashby herein referred as Ashby's method) is more popular in engineering application. Ashby's method employs charts, plotted based on the mechanical and physical properties of the materials available in manufacturer's material databases. Material performance indices are obtained for a specific problem and plotted on the chart. Then, the materials which lie on these performance indices are selected for a given problem. According to Ashby's method achieving the match with design requirements involves four fundamental steps.
1. A way for translating design necessities into a requirement for material and process.
2. A method for screening out those that cannot meet the specification, leaving a subset of the original menu.
3. A method for ranking the surviving materials and process, identifying those that have the best potential.
4. An approach of searching for supporting information about the top-ranked candidates.

Ashby's methods are widely used in material selection for mechanical components such as gear, shaft, etc. Aceves et al. (Design selection methodology for composite structures. Materials & Design, 29(2):418-426, 2008) considered Ashby's approach for material selection for laminated composite material by utilizing finite element method and constraints on cost, stress and deflection. It employed the Ashby's chart approach to arrive at a solution after eliminating the points in the graph, which falls outside the metric lines in the graph. All the methods mentioned above, perform material selection by using discrete materials available in manufacturer's databases. These methods perform material selection and sizing separately. Thus, the methods do not take into account the influence of sizing on material selection and vice versa. The solution achieved by such methods may not be the best combination of material plus sizing for a given application. The best combination is achieved by performing material selection and sizing concurrently. In real world applications, often the design objectives are difficult to achieve due to stringent and challenging requirements. In such cases trade-offs are required, in which a compromise solution is sought.

Decision Making Algorithm facilitates the exploration of satisficing solutions when dealing with engineering design problems. Satisficing solutions are good enough but not necessarily optimal. There exists various DMA techniques used to assist design decisions in case of multiple objectives and conflicting requirements. These DMAs have been combined to solve the design problem where influence of sizing and material selection on each other is taken into account. One of the conventional DMAs was utilized for taking decisions that involve multiple trade-offs in the absence of an optimal solution and further involve determining design variables to achieve multiple conflicting objectives and satisfy multiple constraints. Other DMA was utilized for taking decisions that involve making a choice among a number of alternatives considering several attributes.

Composite structures are multiscale (refer FIG. 1) in nature, its mechanical properties depend on the microstructure, its constituents and their arrangements. These properties were explicitly obtained through structure-property relations known in the conventional art (e.g., refer "The elastic moduli of fiber-reinforced materials. Journal of applied mechanics, 31(2):223-232, 1964 by Hashin et al."). These relations were used to obtain suitable material properties by altering the microstructure. Material selection in concurrent design approach was still carried out using discrete materials mentioned in manufacturer's datasheets. Thus, the approach does not exploit the tailorable nature of composites entirely. Concurrent design solutions can be further improved upon by including this tailorable nature of composites in the design workflow itself. In the present disclosure, a multiscale design approach is implemented to obtain an improvised solution by using multiscale models. These models compute bulk material properties from their microstructures through structure-property relationships. In the method of the present disclosure, based on design goals and constraints, the material microstructure itself evolves to provide better solutions.

In the conventional approach as depicted in FIG. 1, design of a sandwich composite cantilever beam subjected to multiple loads was used as a test problem. More specifically, FIG. 1 depicts multiscale nature of sandwich composite panel. The given problem was solved by using two design approaches namely concurrent design approach and multiscale design approach. In the concurrent design approach a DMA selection technique was used for concurrent material selection and sizing. In the multiscale design approach, the DMA selection technique was combined with the multiscale models to achieve the desirable material properties and sizing. In the multiscale approach, the solution is obtained for different load cases and the properties giving the best performance in all load cases are selected. These desirable material properties have been obtained by designing microstructures through structure-property relationships for each load cases. Multiscale models for skin consist of unidirectional, laminated, braided and woven composites and for core consist of honeycomb, open and closed cell foams. Design efficiency factors were computed for each load cases, and was defined as ratio of target value to the achieved value. Below description depicts the description and problem formulation of design of sandwich composite beam.

Design of a Sandwich Composite Beam

Figure 2:
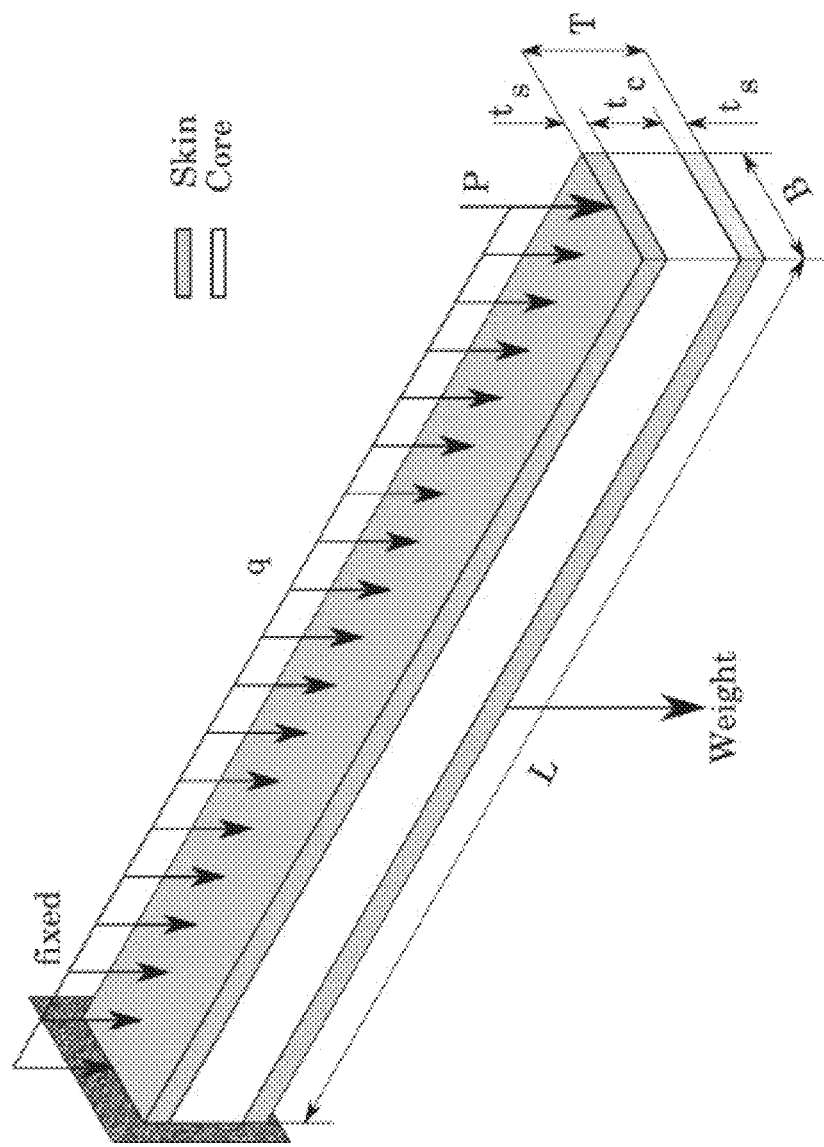
FIG. 2 depicts a sandwich composite cantilever beam.

FIG. 2 depicts a sandwich composite cantilever beam. The sandwich composite beam consists of a lightweight soft core sandwiched between two rigid skins as shown in FIG. 2. It increases bending rigidity (refer below description) by separating skin from its neutral axis. The sandwich composite beam fulfils functional as well as non-functional requirements. Functional requirements of the sandwich are fulfilled by having stiff skin and soft core. Skin carries bending stresses, while core carries shear stresses. Typically, skins are made up of thin metallic sheets or fiber reinforced composites, which offer excellent in plane properties. Cores are usually made up of honeycomb, open and closed cell foams, which offer high specific shear stiffness. These functional properties are utilized while designing lightweight load bearing structures. Such panels are widely used in tail section of aircraft to resist high aerodynamic as well as flutter loads. Non-functional requirements of sandwich beam are fulfilled by incorporating suitable non-functional properties for skin and core materials, for e.g., marine panels are made of corrosion resistant skin and a shear stiffened PVC core.

Deflection of sandwich beam depends on bending and shear rigidity of the beam. High bending rigidity can be achieved by increasing the thicknesses of skin and core materials. However, thicknesses of skin and core material also dictates the weight of the sandwich beam. Thus, the sandwich beam design is a multiple conflicting objective problem. Also, satisfying non-functional requirements along with functional requirements makes the design problem more complex and challenging. Often in such cases no optimal solution is obtained, hence a compromise solution is sought. Description of sandwich design problem is explained below.

Figure 3A:
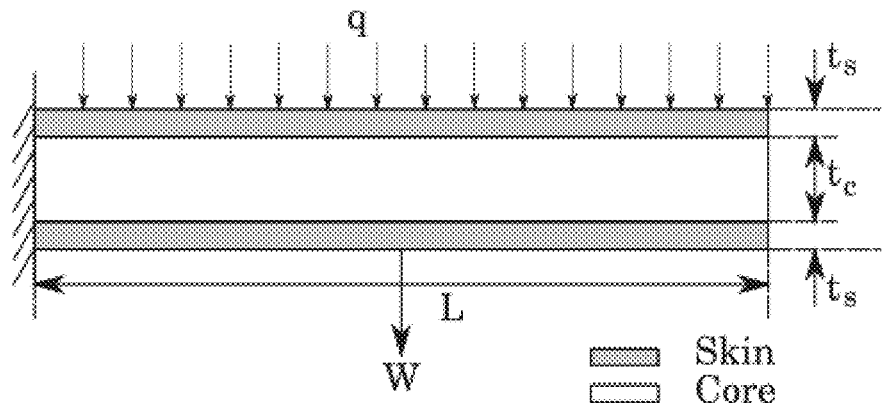
FIGS. 3A through 3C depict various load case scenarios as known in the art.
Figure 3B:
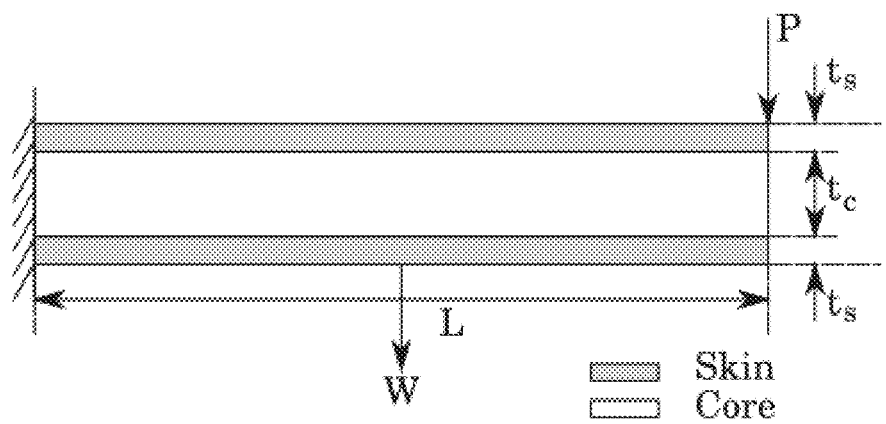
Figure 3C:
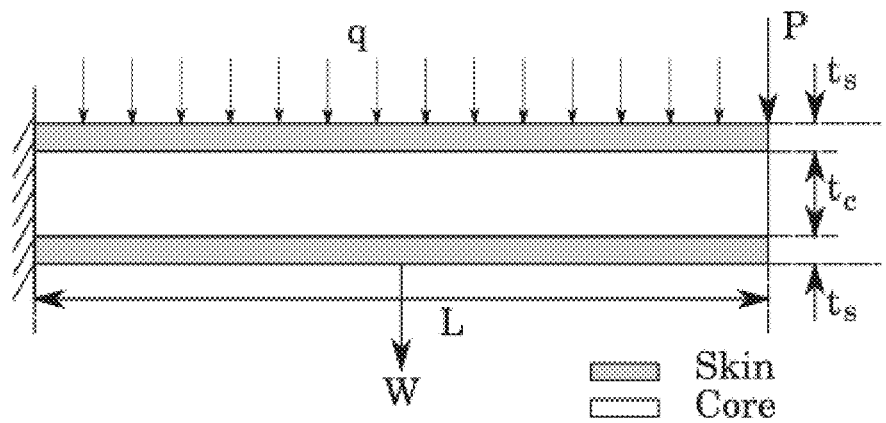

Below explained are design goals, constraint, loading and boundary condition associated with the sandwich beam test problem. The design goal is to achieve target values of weight ($T_w$) and tip deflection ($T_d$) that are 14 N and 10 mm respectively. The constraints to be satisfied are: stresses in skin and core should not exceed their respective strength value by a factor of 0.5. Sandwich beam is subjected to three different types of load case scenarios (LCS). In LCS1 sandwich composite beam is subjected to uniformly distributed load (q) of 1.5 N/mm and self-weight W as shown in FIG. 3A, in LCS2 concentrated point load (P) of 1500 N and self-weight as shown in FIG. 3B and in LCS3 uniformly distributed load, concentrated point load and self-weight as shown in FIG. 3C. More specifically, FIGS. 3A through 3C depict various load case scenarios as known in the art. Analytical equations were used to calculate the deflection and weight as known in the conventional art. Deflection due to UDL ($\delta_q$), weight ($\delta_w$) and end point load ($\delta_p$), has been given by Equations (1), (2) and (3) respectively. The deflection of the beam for LCS1, LCS2, and LCS3 has been given as $\delta_q+\delta_w$, $\delta_w+\delta_p$ and $\delta_q+\delta_w+\delta_p$ respectively. Total weight of the sandwich beam is given by Equation (4).

$$\delta_q = \frac{qL^4}{8(EI)_{eff}} + \frac{qL^2}{2(GA)_{eff}} \quad (1)$$

$$\delta_w = \frac{WL^3}{8(EI)_{eff}} + \frac{WL}{2(GA)_{eff}} \quad (2)$$

$$\delta_p = \frac{PL^3}{3(EI)_{eff}} + \frac{PL}{(GA)_{eff}} \quad (3)$$

$$W = 2t_s BL\rho_s g + t_c BL\rho_c g \quad (4)$$

where effective bending rigidity $(EI)_{eff}$ and shear rigidity $(GA)_{eff}$ is given by Equation (5) and (6) respectively.

$$(EI)_{eff} = \frac{E_s B t_s^3}{6} + \frac{E_s B t_c T^2}{2} \quad (5)$$

$$(GA)_{eff} = \frac{G_c B T^2}{t_c} \quad (6)$$

Design of sandwich beam incorporating both functional and non-functional properties is carried out using concurrent design method and multiscale design approach (refer below description). The compatibility between skin and core materials and their joining process is also an important material selection criterion but it is not considered in the present disclosure.

Concurrent Design Approach

Figure 4:
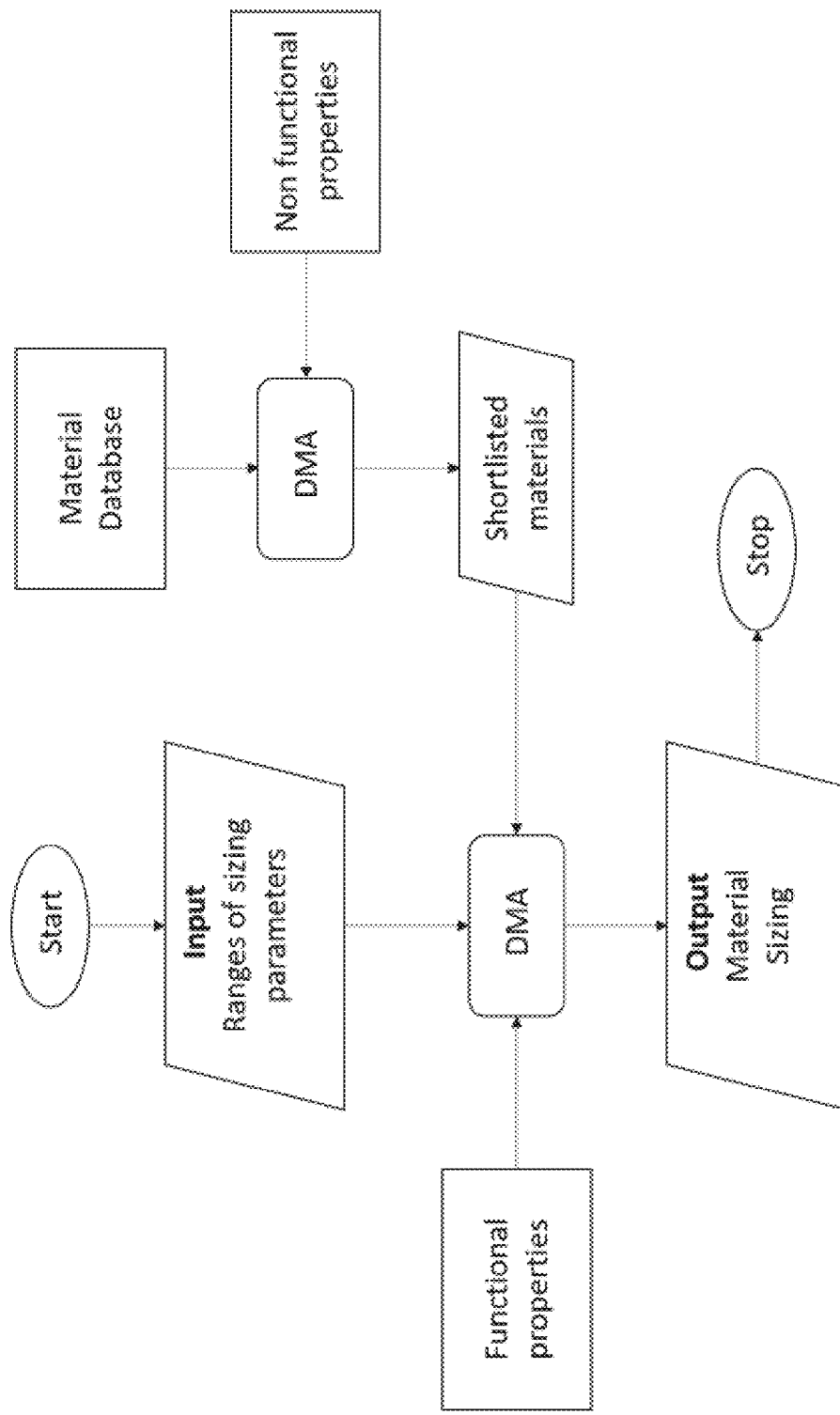
FIG. 4 illustrates a flowchart of a concurrent design approach as known in the art.

In concurrent design approach, the skin and core materials (chosen from the available material databases) and their corresponding thicknesses are selected concurrently by using coupled DMA decision technique which involves a compromise and a selection decision. The compromise decision involves the selection of material of skin and core and their thicknesses against the conflicting requirements of weight and deflection. The approach also takes into account the constraints imposed on stresses in skin and core. The selection decision involves selecting a material from various available alternatives based on non-functional attributes such as cost, corrosion resistance, moisture resistant, chemical resistant, fatigue resistant and thermal insulation. The determination of design variables (compromise part) requires information about material and associated properties (selection part). The two decisions (selection and compromise) are coupled and must account for the impact of the decisions on each other. The flow chart for the process carried out in concurrent design approach is shown in FIG. 4. More specifically, FIG. 4 illustrates a flowchart of a concurrent design approach as known in the art. The functional and normalized non-functional attributes/requirements mentioned in FIG. 2 are depicted in below Table 1.

TABLE 1

| | Functional attributes/requirements | | | | | Non-functional attributes/requirements | | | | | |
|---|---|---|---|---|---|---|---|---|---|---|---|
| Material Name | Material family | Type | E(MPa) | G(MPa) | $\rho\left(\frac{Kg}{m^3}\right)$ | Moisture | Corrosion | Resistance to Chemical | fatigue | Cost | Thermal |
| ELR0908 | E Glass-Epoxy UD | Skin | 31830 | 4910 | 1800 | 1.0 | 0.8 | 0.6 | 0.8 | 0.4 | 0.6 |
| BaltekSB | Balsa | Core | 442.8 | 362 | 285 | 0.2 | 0.8 | 0.4 | 0.8 | 0.6 | 0.8 |
| DivinycellP150 | Polymer Foam | Core | 152 | 40 | 1507 | 1.0 | 0.8 | 0.6 | 1.0 | 0.8 | 0.8 |
| PCGA-XR23003 | Aluminum HC | Core | 1020 | 434 | 83 | 1.0 | 1.0 | 0.8 | 0.6 | 0.4 | 0.2 |
| 2024T3 | Aluminum | Skin | 68900 | 2495- | 2700 | 1.0 | 0.8 | 0.6 | 0.6 | 0.8 | 0.4 |
| CLT0900 | Carbon-Epoxy BX | Skin | 56380 | 4270 | 1530 | 0.4 | 0.6 | 0.6 | 0.6 | 0.8 | 0.4 |
| CL0900 | Carbon-Epoxy UD | Skin | 108450 | 4090 | 1530 | 0.4 | 0.6 | 0.6 | 0.6 | 0.8 | 0.4 |
| AIREXT92130 | Polymer Foam | Core | 140 | 34 | 135 | 1.0 | 0.8 | 0.8 | 1.0 | 1.0 | 0.8 |

The selection decision was taken by comparing the merit-function values of all the materials. The nonfunctional attributes of materials were used for merit-function calculations as known in the conventional art, which is based on the relative importance (I) given to these attributes as shown below Table 2.

TABLE 2

| Selection Attributes | Relative importance (I) |
|---|---|
| Cost | 0.5 |
| Resistant to Moisture | 0.1 |
| Resistant to Corrosion | 0.1 |
| Resistant to Chemical | 0.1 |
| Resistant to Fatigue | 0.1 |
| Insulation to Thermal | 0.1 |

These merit functions are set as goals in the coupled DMA formulation.

The mathematical formulation of coupled DMA to solve the given problem is shown below:

Given:

$$L = 1500 \text{ mm}$$

$$B = \frac{T}{2}$$

The given problem is solved for all the load cases as shown in FIG. 3. The skin and core materials available for selection are shown in Table 2 above.

Find:

Material to be used for skin and core.

Skin thickness ($t_s$), Core thickness ($t_c$).

Satisfy:

Constraint:

Strength criteria for skin: $\sigma_s < 0.5\sigma_y$

Strength criteria for core: $\tau_c < 0.5\tau_y$

Goals:

Merit function value for each material (s=skin, C=core); i=1, ..., 4 and non-functional attributes (j=1, ..., 6) should be as close to 1 as possible.

$$\sum_{j=1}^{6} R_{ij} I_j S_i = 1$$

$$\sum_{j=1}^{6} R_{ij} I_j C_i = 1$$

Meet target deflection ($T_\delta$)=10 mm

Meet target weight ($T_w$)=14 N

Bounds:

$5 \leq t_s$ (mm)$\leq 15$ $70 \leq$(mm)$\leq 90$ $80 \leq T$ (mm)$\leq 110$

Minimize: Objective Function

In above conventional approach, the input values as mentioned in the mathematical formulation are the discrete materials available in databases and ranges of thicknesses of skin and core. The solution was obtained such that it satisfied the strength criteria as mentioned in the constraints of DMA, while achieving the merit function, weight and deflection goals. The preferences are according to designer's choice, in this case equal preferences were given to the achievement of all the goals. The preferences were given as weights for each goal. The formulated approach minimizes the objective function to achieve the goals.

An efficiency factor is defined as ratio of target values to the achieved values $$\left(\eta_i = \frac{T_t}{i}\right)_{i=W,\delta}.$$

In the given test case problem, lower values of weight and deflection are always preferred. Thus, $\eta=100$ indicates that the achieved values are equal or lower than the specified target values. The solution (skin and core materials and their thicknesses) and efficiencies for all the load cases are shown in below Table 3.

TABLE 3

| Test Problems | Selected Materials | Sizing (mm) | W(N) | δ(mm) | Efficiency (%) $\eta_W$ | $\eta_\delta$ |
|---|---|---|---|---|---|---|
| LCS1 | $M\begin{cases}\text{Skin}=CL0900\\\text{Core}=PCGA-XR23003\end{cases}$ | $T1\begin{cases}t_s=5.03\\t_c=89.16\end{cases}$ | 14.98 | 10.01 | 93.46 | 99.93 |
| LCS2 | $M\begin{cases}\text{Skin}=CL0900\\\text{Core}=PCGA-XR23003\end{cases}$ | $T2\begin{cases}t_s=5.13\\t_c=89.75\end{cases}$ | 15.36 | 16.58 | 91.15 | 60.31 |
| LCS3 | $M\begin{cases}\text{Skin}=CL0900\\\text{Core}=PCGA-XR23003\end{cases}$ | $T3\begin{cases}t_s=5.16\\t_c=89.68\end{cases}$ | 15.42 | 26.06 | 90.79 | 38.37 |

M-T1, M-T2, M-T3 as shown in above Table 3 are the specific material and sizing combinations obtained for load cases LCS1, LCS2 and LCS3 respectively. $\eta_w$ and $\eta_\delta$ show the efficiency achieved by the material and sizing combinations for each load cases.

For this design problem, a final solution was obtained by selecting material and sizing combination which provides high efficiencies for all the load cases. The specific material and sizing combinations achieved (M-T1, M-T2, and M-T3) were used to obtain the efficiencies in case of all load cases (LCS1, LCS2, LCS3) as mentioned in below Table 4.

TABLE 4

| Material | Sizing | Test Problems | W (N) | δ (mm) | Efficiency (%) $\eta_W$ | $\eta_\delta$ |
|---|---|---|---|---|---|---|
| M | T1 | LCS1 | 14.98 | 10.01 | 93.46 | 99.93 |
|   |    | LCS2 | 14.98 | 17.24 | 93.46 | 58.00 |
|   |    | LCS3 | 14.98 | 27.18 | 93.46 | 36.79 |
| M | T2 | LCS1 | 15.36 | 9.63  | 91.15 | 103.80 |
|   |    | LCS2 | 15.36 | 16.58 | 91.15 | 60.31 |
|   |    | LCS3 | 14.98 | 27.18 | 93.46 | 36.79 |
| M | T3 | LCS1 | 15.42 | 9.60  | 90.79 | 104.18 |
|   |    | LCS2 | 15.42 | 16.52 | 90.79 | 60.53 |
|   |    | LCS3 | 15.42 | 26.06 | 90.79 | 38.37 |

It can be observed that the solution M (Skin CL0900, Core PCGA-XR23003) T3 ($t_s$=5.16 mm, $t_c$=89.68 mm) offers the best efficiency of deflection for all load cases. As the efficiency factor for weight is nearly the same for all the materials, M-T3 was selected as final solution. In the above concurrent design approved, material development is decoupled from the design and hence material development lacks in terms of accuracy and may be prone to error for identifying suitable microstructures and design of mechanical systems.

Referring now to the drawings, and more particularly to FIGS. 5 through 10, where similar reference characters denote corresponding features consistently throughout the figures, there are shown preferred embodiments and these embodiments are described in the context of the following exemplary system and/or method.

Figure 5:
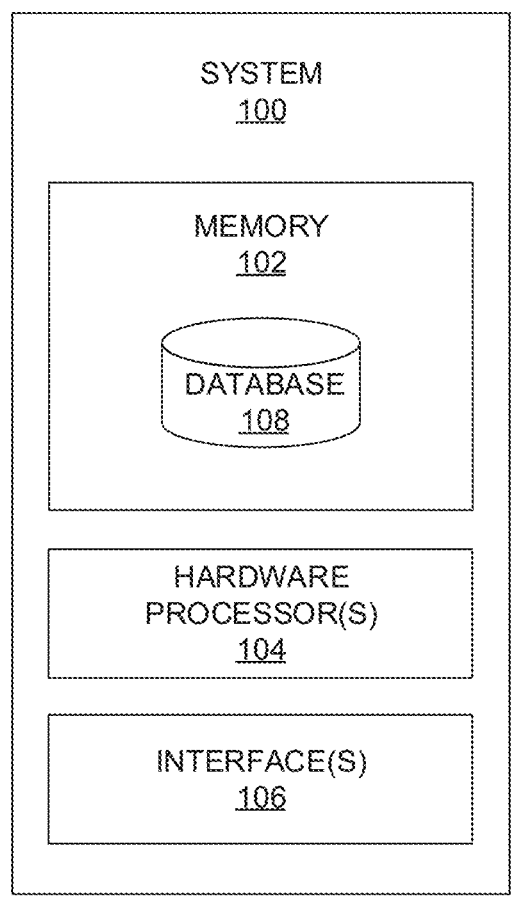
FIG. 5 depicts an exemplary block diagram of a system for multiscale materials selection and designing of mechanical systems thereof, in accordance with an embodiment of the present disclosure.

FIG. 5 depicts an exemplary block diagram of a system 100 for multiscale materials selection and designing of mechanical systems thereof, in accordance with an embodiment of the present disclosure. The system 100 may also be referred as 'multiscale design system' and may be interchangeably used hereinafter. In an embodiment, the system 100 includes one or more hardware processors 104, communication interface device(s) or input/output (I/O) interface(s) 106 (also referred as interface(s)), and one or more data storage devices or memory 102 operatively coupled to the one or more hardware processors 104. The one or more processors 104 may be one or more software processing components and/or hardware processors. In an embodiment, the hardware processors can be implemented as one or more microprocessors, microcomputers, microcontrollers, digital signal processors, central processing units, state machines, logic circuitries, and/or any devices that manipulate signals based on operational instructions. Among other capabilities, the processor(s) is configured to fetch and execute computer-readable instructions stored in the memory. In an embodiment, the system 100 can be implemented in a variety of computing systems, such as laptop computers, notebooks, hand-held devices, workstations, mainframe computers, servers, a network cloud and the like.

The I/O interface device(s) 106 can include a variety of software and hardware interfaces, for example, a web interface, a graphical user interface, and the like and can facilitate multiple communications within a wide variety of networks N/W and protocol types, including wired networks, for example, LAN, cable, etc., and wireless networks, such as WLAN, cellular, or satellite. In an embodiment, the I/O interface device(s) can include one or more ports for connecting a number of devices to one another or to another server.

The memory 102 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. In an embodiment, a database 108 is comprised in the memory 102, wherein the database 108 comprises information, for example, input pertaining to a mechanical problem, structural design problem, a dynamic problem and a vibrational problem, a set of unique material properties being computed for an input type, range of values specific to the set of unique material properties and a plurality of sizing parameters corresponding to a plurality of physical materials for the input, selection information on subset of (i) the set of unique material properties and (ii) the plurality of sizing parameters of the physical materials, one or more functional properties and non-functional properties, microstructures identification, and the like. In an embodiment, the memory 102 may store (or stores) one of more techniques (e.g., selection technique such as decision making algorithms, and the like). The memory 102 further comprises (or may further comprise) information pertaining to input(s)/output(s) of each step performed by the systems and methods of the present disclosure. In other words, input(s) fed at each step and output(s) generated at each step are comprised in the memory 102, and can be utilized in further processing and analysis.

Figure 6:
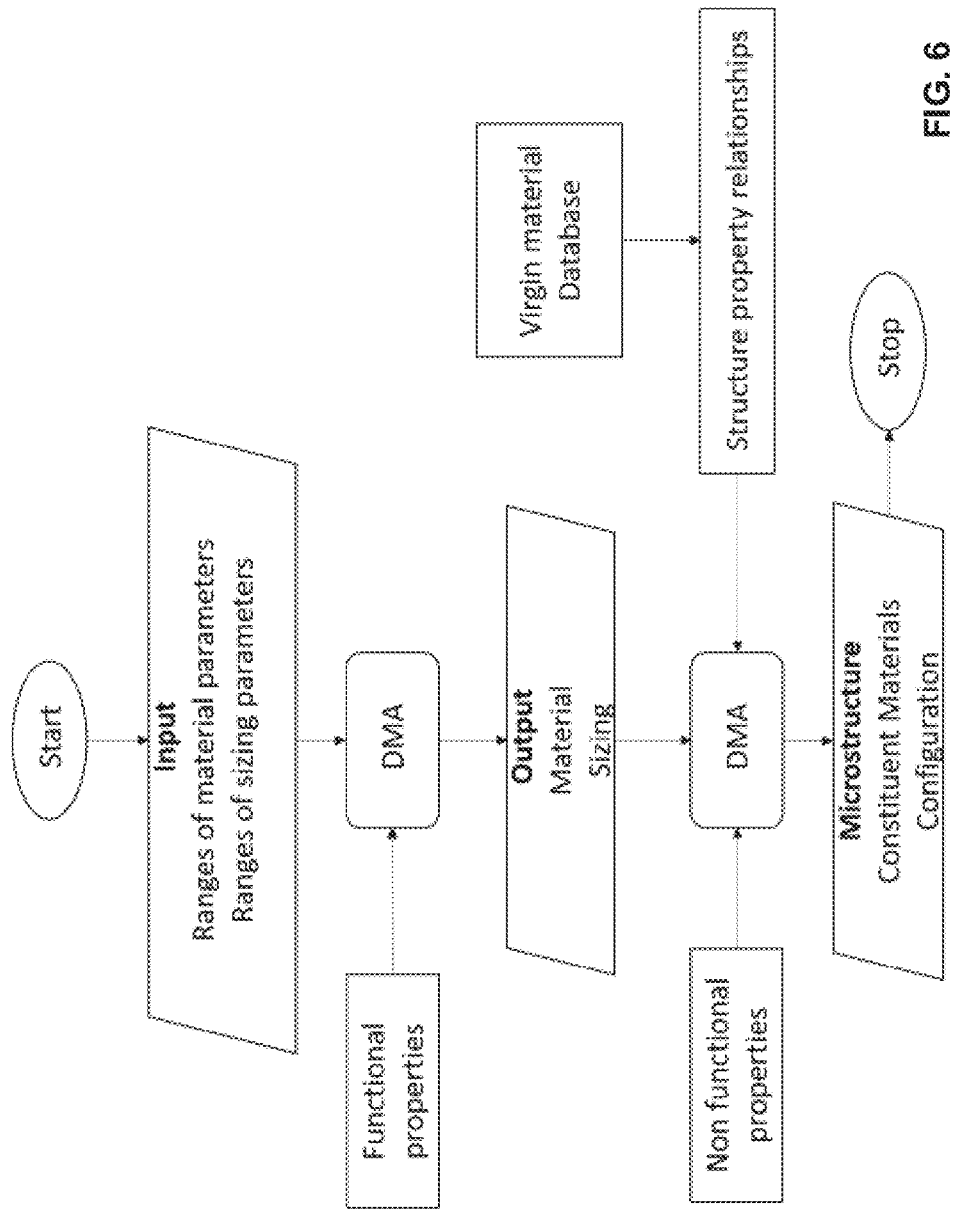
FIG. 6 depicts an exemplary flow chart depicting multiscale materials selection and designing of mechanical systems thereof, using the system of FIG. 5 in accordance with an embodiment of the present disclosure.

FIG. 6, with reference to FIG. 5, depicts an exemplary flow chart depicting multiscale materials selection and designing of mechanical systems thereof, using the system 100 of FIG. 5 in accordance with an embodiment of the present disclosure.

Figure 7:
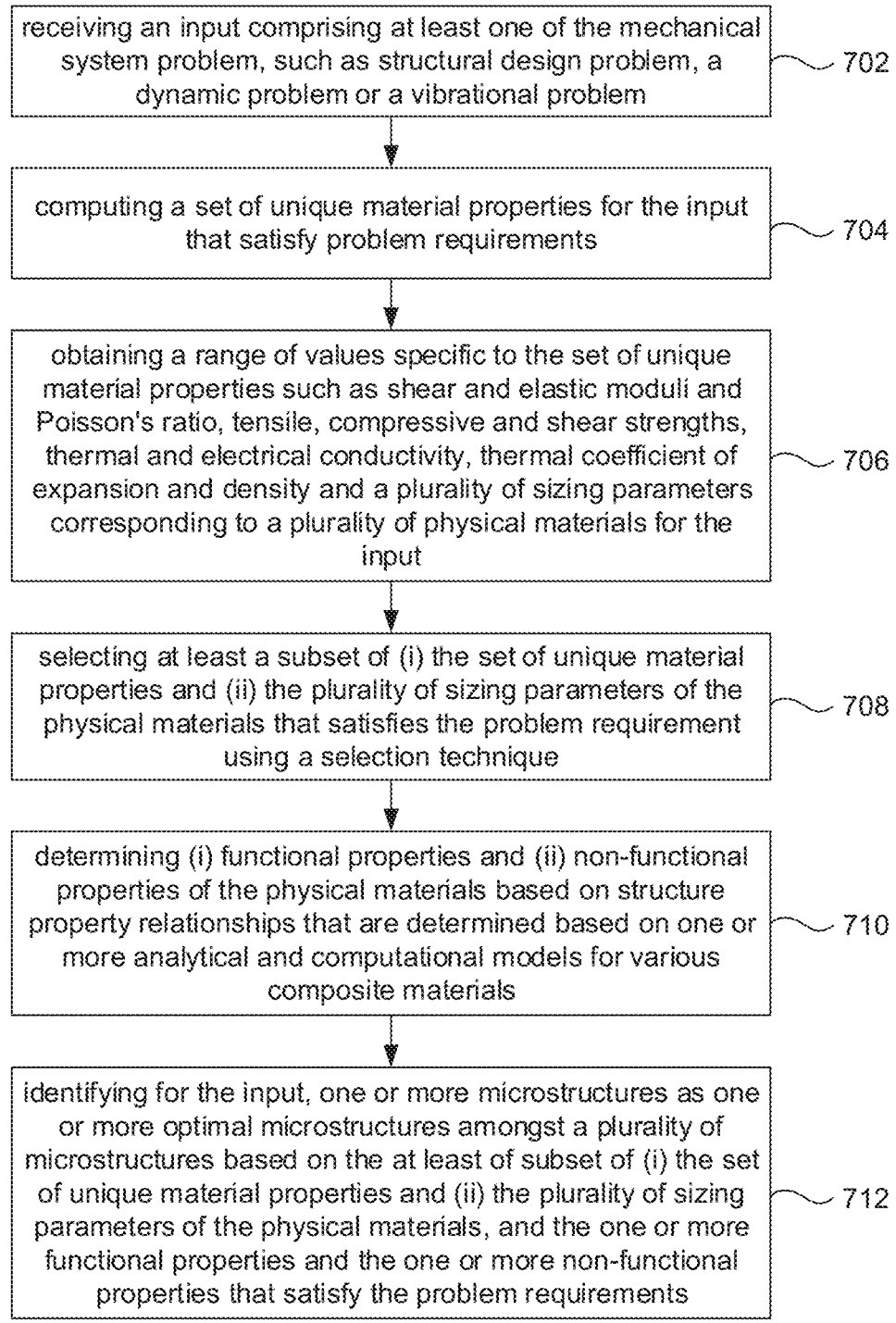
FIG. 7 is an exemplary flow diagram illustrating a method for multiscale materials selection and designing of mechanical systems thereof using the system of FIG. 5, in accordance with an embodiment of the present disclosure.

FIG. 7, with reference to FIGS. 5-6, is an exemplary flow diagram illustrating a method for multiscale materials selection and designing of mechanical systems thereof using the system 100 of FIG. 5, in accordance with an embodiment of the present disclosure. In an embodiment, the system(s) 100 comprises one or more data storage devices or the memory 102 operatively coupled to the one or more hardware processors 104 and is configured to store instructions for execution of steps of the method by the one or more processors 104. The steps of the method of the present disclosure will now be explained with reference to components of the system 100 of FIG. 5, the flow chart of FIG. 6, and the flow diagram as depicted in FIG. 7. At step 702 of the present disclosure, the one or more hardware processors 104 receive an input comprising at least one of a mechanical problem, structural design problem, a dynamic problem and a vibrational problem. Examples of mechanical systems comprise but are not limited to structural design, a dynamic design and a vibrational design, and the like. At step 704 of the present disclosure, the one or more hardware processors 104 compute a set of unique material properties (e.g., material physical properties) for the input that satisfies one or more problem requirements. At step 706 of the present disclosure, the one or more hardware processors 104 obtain a range of values specific to the set of unique material properties (e.g., elastic moduli, density, shear modulus, conductivity, thermal coefficient of expansion, Poisson's ratio, and the like) and a plurality of sizing parameters corresponding to a plurality of physical materials for the input. In the present disclosure, the range of values specific to the one or more properties are obtained based on a calculation of minimum and maximum values of the set of unique material properties and by using one or more structure property models (refer below Table 6 for range of values). In the present disclosure range of values of material properties and sizing parameters are depicted in below Table 6.

At step 708 of the present disclosure, the one or more hardware processors 104 select at least a subset of (i) the set of unique material properties and (ii) the plurality of sizing parameters of the physical materials, using a selection technique. In an embodiment of the present disclosure, the selection technique is a decision-making algorithm.

At step 710 of the present disclosure, the one or more hardware processors 104 determine (i) one or more functional properties and (ii) one or more non-functional properties of the one or more physical materials based on structure property relationships, wherein the structure property relationships are determined based on one or more analytical and computational models for various composite materials. In the present disclosure, the steps 708 and 710 can be either executed/performed sequentially or in parallel. At step 712 of the present disclosure, the one or more hardware processors 104 identify for the input that satisfies the one or more problem requirements, one or more microstructures as one or more optimal microstructures amongst a plurality of microstructures based on the at least of subset of (i) the set of unique material properties and (ii) the plurality of sizing parameters of the physical materials, and the one or more functional properties and the one or more non-functional properties. In one embodiment, the one or more microstructures are obtained and identified as the optimal microstructure when a value of the one or more functional properties and the one or more non-functional properties of one or more components and sub-components of a physical material from the plurality of physical materials is less than or equal to a pre-defined threshold for the input. In another embodiment, the one or more microstructures are obtained and identified as the optimal microstructure when (i) a value of the one or more functional properties and the one or more non-functional properties of one or more components and sub-components of a physical material from the plurality of physical materials is greater than or equal to a pre-defined threshold for the input. In yet another embodiment, the one or more microstructures are obtained and identified as the optimal microstructure when (i) a value of the one or more functional properties and the one or more non-functional properties of one or more components and sub-components of a physical material from the plurality of physical materials are between a first pre-defined threshold and a second pre-defined threshold for the input. Density, weight, cost, etc., are few non-construing examples of functional properties for the scenario one. These are typically mentioned with maximum threshold values. Structures, components, and sub-components which yield functional properties less than or equal to maximum threshold values are considered as optimum design(s). Maximum threshold value of density of the skin (sub-component)

$$\left(1679 \frac{Kg}{m^3}\right)$$

and density of the core (sub-component)

$$\left(31 \frac{Kg}{m^3}\right)$$

are mentioned in test case example of sandwich beam design. Strength, stiffness, strain energy release rate, fracture toughness, etc., are few non-construing examples of functional properties for the scenario two. These are typically mentioned with minimum threshold values. Structures, components, and sub-components which yield greater than or equal to maximum threshold values are considered as optimum design(s). Minimum threshold value of axial stiffness of the skin (sub-component) (204309 MPa) and shear stiffness of the core (sub-component) (193 MPa) are mentioned in test case example of sandwich beam design. If scenario one is provided with minimum possible value along with maximum threshold value and scenario two is provided with maximum possible value along with minimum threshold value, then scenario three is generated. Density should be greater than zero and less than or equal to maximum threshold value is shown in the core $$\left(0 < \text{density} \frac{Kg}{m^3} <= 1679\right)$$

and the skin $$\left(0 < \text{density} \frac{Kg}{m^3} <= 31\right)$$

design of sandwich beam.

The above steps 702 till 712 can be better understood by way of examples as shown below and shall not be construed as limiting the scope of the present disclosure and its embodiments:

The method of the present disclosure as depicted in FIGS. 6 and 7 are implemented to achieve better design efficiencies as compared to the concurrent design approach as known in the conventional art. In the method of FIGS. 6 and 7, initially, the material properties of skin, core and their thicknesses are treated as variables and given appropriate ranges. The appropriate ranges of skin and core material properties are given in Table 5.

TABLE 5

| Material properties | Type | Minimum | Maximum |
|---|---|---|---|
| Elastic modulus (MPa) | Skin | 94060 | 204310 |
| Density $\left(\frac{Kg}{m^3}\right)$ | Skin | 1406 | 1651 |
| Shear Modulus (MPa) | Core | 21.6 | 536.6 |
| Density $\left(\frac{Kg}{m^3}\right)$ | Core | 3.4 | 86.3 |

Figure 8:
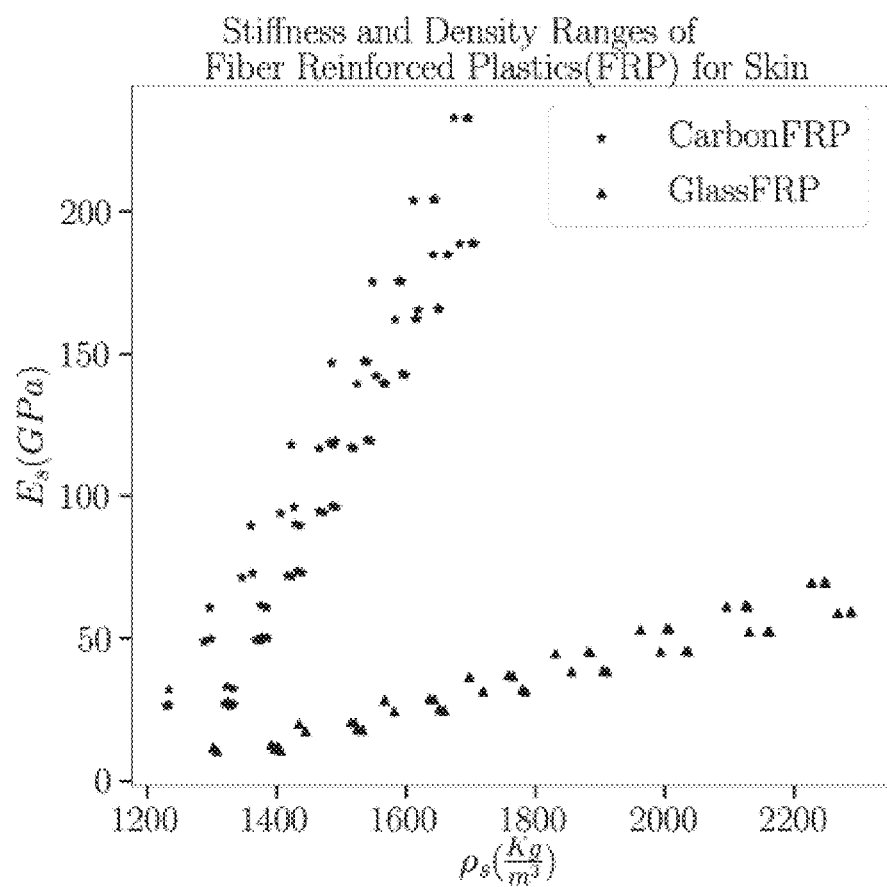
FIG. 8 depicts a graphical representation of elastic modulus and density ranges for the skin material, in accordance with an example embodiment of the present disclosure.
Figure 9:
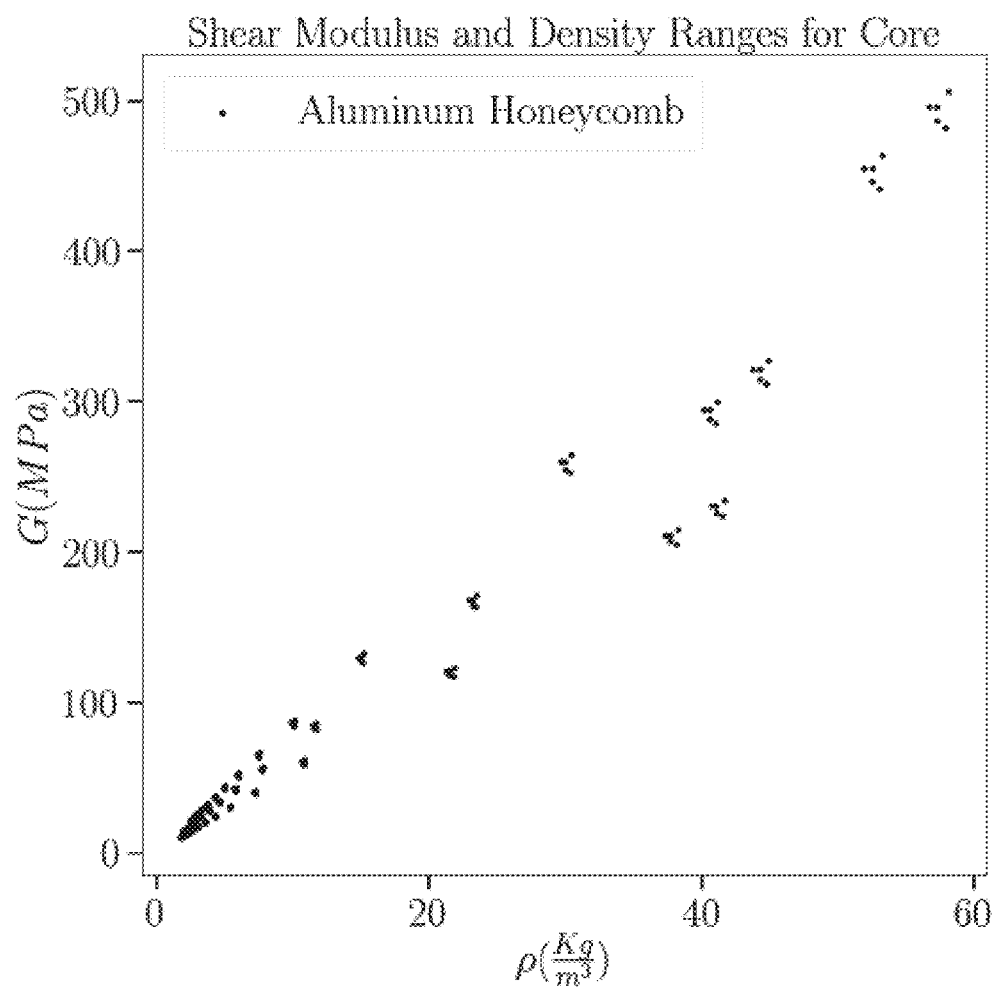
FIG. 9 depicts a graphical representation of shear modulus and density ranges for the core material, in accordance with an example embodiment of the present disclosure.

These ranges are obtained after calculating the minimum and maximum values of skin and core material properties through structure property models for variety of input values as shown in FIG. 8 and FIG. 9 respectively. More specifically, FIG. 8, with reference to FIGS. 5 through 7, depicts a graphical representation of elastic modulus and density ranges for the skin material, in accordance with an example embodiment of the present disclosure. FIG. 9, with reference to FIGS. 5 through 8, depicts a graphical representation of shear modulus and density ranges for the core material, in accordance with an example embodiment of the present disclosure.

Then, the selection technique (e.g., the decision making algorithm comprised in the memory 102) is invoked and executed to obtain suitable material properties of skin, core and their thicknesses against the conflicting requirements of weight, deflection and the strength constraints imposed on skin and core materials. In the end, the structure property relationships are used to obtain microstructures that provide these suitable material properties. The microstructure is chosen such that it also satisfies the non-functional requirements for given problem as depicted in step 712.

This approach is formulated as a decision making problem as shown below:

Given:

$$L = 1500 \text{ mm}$$

$$B = \frac{T}{2}$$

The given problem is solved for all the load cases as shown in FIG. 3.

Find:
Suitable material properties ($E_s$, $\rho_s$, $G_c$, $\rho_c$, $t_s$, $t_c$)
Skin thickness, $t_s$, Core thickness, $t_c$ Satisfy:
System Constraint:
Strength criteria for skin: $\sigma_s \leq 0.56$,
Strength criteria for core: $\tau_c \leq 0.5 T_c$ Goals:
Meet target deflection ($T_w$)=10 mm
Meet target weight ($T_w$)=14 N Bounds:

$$5 \leq t_s(\text{mm}) \leq 15$$

$$70 \leq t_c(\text{mm}) \leq 90$$

$$94060 \leq E_s(MPa) \leq 204310$$

$$1406 \leq \rho_s\left(\frac{Kg}{m^3}\right) \leq 1651$$

$$21.6 \leq G_c(MPa) \leq 536.6$$

Minimize: Objective Function

In the mathematical formulation, the input values are the material properties and thickness ranges of skin and core. The solution is obtained such that it satisfies the strength criteria as mentioned in the constraints of decision making problem algorithm, while achieving weight and deflection goals. In this case also equal preferences were assigned to the goals. The formulated approach minimizes the objective function to achieve these goals. The solution (skin and core materials and their thicknesses) and efficiencies for all the load cases are shown in below Table 6.

TABLE 6

| Test Problems | Material $E, G$: Mpa $\rho$: $\left(\frac{Kg}{m^3}\right)$ | | Sizing | W(N) | δ(mm) | Efficiency (%) | |
|---|---|---|---|---|---|---|---|
| | | | | | | $\eta_W$ | $\eta_\delta$ |
| LCS1 | M1 | $E_s = 160250$ $\rho_s = 1595.48$ $G_c = 150$ $\rho_c = 24.17$ | T1 * $\{t_s = 6.06 \atop t_c = 79.6$ | 14.34 | 9.11 | 97.63 | 109.77 |
| LCS2 | M2 | $E_s = 202587.34$ $\rho_s = 1676.17$ $G_c = 219$ $\rho_c = 204310$ | T2 * $\{t_s = 5.02 \atop t_c = 89.95$ | 14.72 | 10.08 | 95.11 | 99.20 |

TABLE 6-continued

| Test Problems | Material $E, G: Mpa$ $\rho: \left(\frac{Kg}{m^3}\right)$ | Sizing | W(N) | δ(mm) | Efficiency (%) $\eta_W$ | $\eta_\delta$ |
|---|---|---|---|---|---|---|
| LCS3 | M3 $\begin{cases} E_s = 204310 \\ \rho_s = 1679.25 \\ G_c = 193 \\ \rho_c = 31.07 \end{cases}$ | T3* $\begin{cases} t_s = 5.36 \\ t_c = 90 \end{cases}$ | 15.34 | 15.5 | 91.26 | 64.52 |

M1-T1*, M2-T2* and M3-T3* are the specific material and sizing combinations obtained for load cases LCS1, LCS2 and LCS3 respectively. The columns $\eta_w$ and $\eta_\delta$ show the efficiency achieved by the material and sizing combinations for each load case. A final solution is obtained by selecting a material and sizing combination, which provides high efficiencies for all the load cases. The specific material and sizing combinations achieved (M1-T1*, M2-T2*, M3-T3*) are used to obtain the efficiencies in case of all load cases (LCS1, LCS2, LCS3) as mentioned in below Table 7.

TABLE 7

| Material | Sizing | Test Problems | W (N) | δ (mm) | Efficiency (%) $\eta_W$ | $\eta_\delta$ |
|---|---|---|---|---|---|---|
| M1 | T1 * | LCS1 | 14.34 | 9.11 | 97.63 | 109.77 |
|  |  | LCS2 | 14.34 | 15.12 | 97.67 | 66.14 |
|  |  | LCS3 | 14.34 | 24.17 | 97.63 | 41.37 |
| M2 | T2 * | LCS1 | 14.72 | 6.035 | 95.11 | 165.70 |
|  |  | LCS2 | 14.72 | 10.08 | 95.11 | 99.20 |
|  |  | LCS3 | 14.72 | 16.08 | 95.11 | 62.19 |
| M3 | T3 * | LCS1 | 15.34 | 5.85 | 91.25 | 170.88 |
|  |  | LCS2 | 15.34 | 9.68 | 91.25 | 103.31 |
|  |  | LCS3 | 15.34 | 15.5 | 91.26 | 64.52 |

It can be observed that the solution M3

$$\left(E_s = 204310 \ MPa \rho_s = 1679.25 \left(\frac{Kg}{m^3}\right)\right.$$
$$G_c = 193. \ MPa \rho_c = 31.07 \left(\frac{Kg}{m^3}\right),$$
$$T3*(t_s = 5.36 \ mm, t_c = 90 \ mm)$$

yields the best efficiency of deflection for all load cases. As the efficiency factor for weight is nearly same for all the materials, M3-T3* was selected during the experiments conducted by the present disclosure as final solution. It can be observed that the multiscale approach achieves target goals better as compared to concurrent design approach for all the load cases as shown in below Table 8.

TABLE 8

| Selected Material | LCS1 $\eta_W$ | $\eta_\delta$ | LCS2 $\eta_W$ | $\eta_\delta$ | LCS3 $\eta_W$ | $\eta_\delta$ |
|---|---|---|---|---|---|---|
| Concurrent design approach M-T3 | 90.79 | 104.18 | 90.79 | 60.53 | 90.79 | 38.37 |
| Multiscale approach M3-T3* | 91.25 | 170.88 | 91.25 | 103.31 | 91.26 | 64.52 |

The structure property relationships are then used to design microstructures that provide the material properties selected in multiscale design approach (M3). The microstructure is chosen such that it also satisfies the non-functional requirements for given problem. The M3 material's mechanical properties are set as target values to obtain the microstructure. Thus, the target values for skin and core namely $$E_s^r = 204309 \ MPa, \rho_s^t = 1679 \frac{Kg}{m^3} \text{ and } G_c^t = 193 \ MPa.$$

$$\rho_c^t = 31 \frac{Kg}{m^3}$$

are sought.

Skin Microstructure

The skins in the sandwich composites are typically made up of long fiber reinforced polymer composites (e.g., UD, BIAX, woven) consisting of various fibers and matrix as shown in below Table 9.

TABLE 9

| Material | E(GPa) | v | $\rho\left(\frac{Kg}{m^3}\right)$ | Type |
|---|---|---|---|---|
| AS-4 Carbon | 235 | 0.2 | 1810 | Fiber |
| T-300 Carbon | 230 | 0.2 | 1760 | Fiber |
| IM7 Carbon | 290 | 0.2 | 1800 | Fiber |
| E-glass | 73 | 0.23 | 2540 | Fiber |
| S-glass | 86 | 0.23 | 2490 | Fiber |
| Epoxy 3501-6 | 4.3 | 0.35 | 1270 | Matrix |
| Epoxy (977-3) | 3.7 | 0.35 | 1280 | Matrix |
| Epoxy (Hy6010) | 3.4 | 0.36 | 1170 | Matrix |

The one or more microstructures that yield $E_s \geq E_s^t$ and $\rho_s \leq \rho_s^t$ are chosen as suitable microstructures. In this problem as mentioned above by the present disclosure, the functional and non-functional requirements for skins are only achieved by unidirectional fiber reinforced composites as it yields high longitudinal specific stiffness as compared to the biaxial and woven composite. The structure property relationship for skin as mentioned and known in the conventional art (e.g., refer "The elastic moduli of fiber-reinforced materials. Journal of applied mechanics, 31(2):223-232, 1964 by Hashin et al.") were used to obtain the microstructure yielding the desirable properties. The suitable lamina and its constituent are shown in below Table 10.

TABLE 10

| $V_f$ | $E_s$(GPa) | $\rho_s\left(\frac{Kg}{m^3}\right)$ | $\dfrac{E_s(GPa)}{\rho_s\left(\frac{Kg}{m^3}\right)}$ | Fiber (Carbon) | Matrix (Epoxy) |
|---|---|---|---|---|---|
| 70 | 204 | 1641 | 0.125 | IM7 | 3501-6 |

In case of complicated loading, that involves inter-laminar stresses and delamination, a woven or braided composite is more suitable for achieving functional and non-functional requirements.

Core Microstructure

Figure 10:
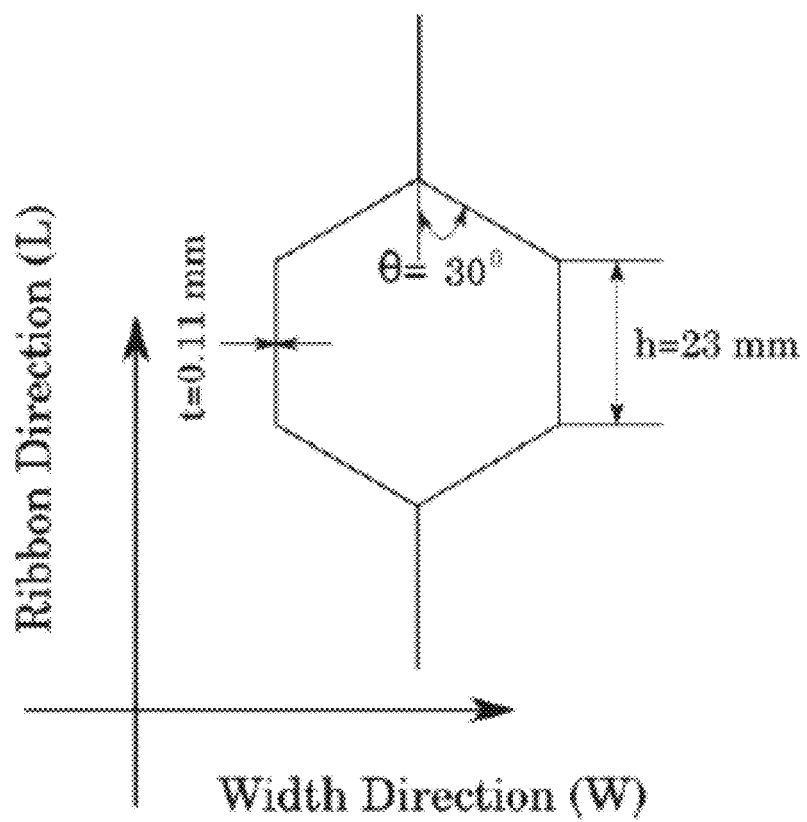
FIG. 10 depicts an aluminum honeycomb microstructure having best $G_c/\rho_c$ ratio, in accordance with an example embodiment of the present disclosure.

The core materials are typically made up of honeycomb, open and closed cell foams. The microstructures that yield $G_c \geq G_c^t$ and $\rho_c < \rho_c^t$ are chosen as suitable microstructures. In this problem as mentioned above by the present disclosure, the functional and non-functional requirements for the core are only achieved by aluminum honeycomb as it offers high specific shear stiffness as compared to the open and closed cell foams. The structure property relationship for core as mentioned and known in the conventional art (e.g., refer "The shear modulus of foil honeycomb cores: A theoretical and experimental investigation on cores used in sandwich construction. Aircraft Engineering and Aerospace Technology, 30(10):294-302, 1958. By Kelsey et al.") was used to obtain the microstructure yielding the desirable properties. The obtained microstructures are shown in below Table 11. The microstructure having best specific shear stiffness $$\left(\frac{G_c}{\rho_c}\right)$$

as shown in FIG. 10. More specifically, FIG. 10, with reference to FIGS. 5 through 9, depicts an aluminum honeycomb microstructure having best $$\frac{G_c}{\rho_c}$$

ratio, in accordance with an example embodiment of the present disclosure.

TABLE 11

| t(mm) | h(mm) | θ° | $G_c$(MPa) | $\rho_c\left(\frac{Kg}{m^3}\right)$ | $\dfrac{G_c(MPa)}{\rho_c\left(\frac{Kg}{m^3}\right)}$ |
|---|---|---|---|---|---|
| 0.11 | 23 | 30 | 232 | 27.68 | 8.383 |
| 0.01 | 2 | 30 | 242 | 28.94 | 8.382 |
| 0.11 | 22 | 30 | 242 | 28.94 | 8.382 |
| 0.11 | 24 | 30 | 222 | 26.53 | 8.381 |
| 0.11 | 25 | 30 | 213 | 25.47 | 8.381 |
| 0.11 | 17 | 45 | 203 | 28.95 | 7.014 |

In the present disclosure, design of a sandwich composite beam is carried out using concurrent design approach and multiscale design approach. In the former approach, decision making algorithm (DMA) formulations were used to select material for skin and core and their thicknesses for multiple conflicting requirements. Later approach combines decision making algorithm and multiscale models to arrive at material properties, material microstructures and sizing for the test problem. Design efficiency (η) showing the achievement of target values was computed for each approach. A unique set of material and thicknesses was selected as final solution that achieves better overall efficiencies for all the load cases. The multiscale approach as implemented by the present disclosure shows higher design efficiencies as compared to the concurrent design approach. The target material properties in the multiscale approach were achieved by the explicit structure property relations. The final microstructure for skin and core can be selected from the admissible solutions mentioned in Table 10 and Table 11. The multiscale design approach/method as implemented by the embodiments of the present disclosure and the system 100 of FIG. 5 facilitates the following:

1. Tailoring multiscale nature of the composite material to achieve the desired target properties by selecting and arranging the constituents.
2. Exploring large design space to achieve best performance efficiencies.
3. Manufactures can use this methodology to serve designers better by creating new materials, as the former approach has limited selection options.
4. In composite structures, failure is governed by local microstructure behavior, this can also be incorporated in the multiscale approach as a design criterion while obtaining the suitable microstructure.
5. For the combined loadings (e.g., bending and torsion) multiscale approach has a potential to evolve to find the suitable microstructure such as braided composite or laminated composite with varying stacking sequences.
6. Functionally graded materials or hybrid composite can also be obtained by multiscale approach based on designer requirements.

The approach as implemented by the present disclosure can solve any design problem in which structure property relations exists between the materials to be used in selection and their microstructures.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software processing components located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various components described herein may be implemented in other components or combinations of other components. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A processor implemented method, comprising:
receiving, via one or more hardware processors, an input comprising at least one of a mechanical system problem, a structural design problem, a dynamic problem and a vibrational problem;
computing, via the one or more hardware processors, a set of unique material properties for the input that satisfies one or more problem requirements;
obtaining, via the one or more hardware processors, a range of values specific to (i) the set of unique material properties comprising shear and elastic moduli and Poisson's ratio, tensile, compressive and shear strengths, thermal and electrical conductivity, thermal coefficient of expansion and density and (ii) a plurality of sizing parameters corresponding to a plurality of physical materials for the input;
selecting, via the one or more hardware processors, at least a subset of (i) the set of unique material properties and (ii) the plurality of sizing parameters of the physical materials that satisfies the problem requirement using a selection technique;
determining (i) one or more functional properties and (ii) one or more non-functional properties of the one or more physical materials based on structure property relationships, wherein the structure property relationships are determined based on one or more analytical and computational models for various composite materials; and
identifying for the input, one or more microstructures as one or more optimal microstructures amongst a plurality of microstructures based on the at least of subset of (i) the set of unique material properties and (ii) the plurality of sizing parameters of the physical materials, and the one or more functional properties and the one or more non-functional properties that satisfy the one or more problem requirements.

2. The processor implemented method as claimed in claim 1, wherein the range of values specific to the one or more properties are obtained based on a calculation of minimum and maximum values of the set of unique material properties and by using one or more structure property models.

3. The processor implemented method as claimed in claim 1, wherein the selection technique is a Decision-Making Algorithm (DMA).

4. The processor implemented method as claimed in claim 1, wherein the one or more microstructures are obtained and identified as the optimal microstructure when a value of the one or more functional properties and the one or more non-functional properties of one or more components and sub-components of a physical material from the plurality of physical materials is less than or equal to a pre-defined threshold for the input.

5. The processor implemented method as claimed in claim 1, wherein the one or more microstructures are obtained and identified as the optimal microstructure when a value of the one or more functional properties and the one or more non-functional properties of one or more components and sub-components of a physical material from the plurality of physical materials is greater than or equal to a pre-defined threshold for the input.

6. The processor implemented method as claimed in claim 1, wherein the one or more microstructures are obtained and identified as the optimal microstructure when a value of the one or more functional properties and the one or more non-functional properties of one or more components and sub-components of a physical material from the plurality of physical materials are between a first pre-defined threshold and a second pre-defined threshold for the input.

7. A system, comprising:
a memory storing instructions;
one or more communication interfaces; and
one or more hardware processors coupled to the memory via the one or more communication interfaces, wherein the one or more hardware processors are configured by the instructions to:

receive an input comprising at least one of a mechanical system problem, a structural design problem, a dynamic problem and a vibrational problem;

compute a set of unique material properties for the input that satisfies one or more problem requirements;

obtain a range of values specific to (i) the set of unique material properties comprising shear and elastic moduli and Poisson's ratio, tensile, compressive and shear strengths, thermal and electrical conductivity, thermal coefficient of expansion and density, and (ii) a plurality of sizing parameters corresponding to a plurality of physical materials for the input;

select at least a subset of (i) the set of unique material properties and (ii) the plurality of sizing parameters of the physical materials that satisfies the problem requirement using a selection technique;

determine (i) one or more functional properties and (ii) one or more non-functional properties of the one or more physical materials based on structure property relationships, wherein the structure property relationships are determined based on one or more analytical and computational models for various composite materials; and identify for the input, one or more microstructures as one or more optimal microstructures amongst a plurality of microstructures based on the at least of subset of (i) the set of unique material properties and (ii) the plurality of sizing parameters of the physical materials, and the one or more functional properties and the one or more non-functional properties that satisfy the one or more problem requirements.

8. The system as claimed in claim 7, wherein the range of values specific to the one or more properties are obtained based on a calculation of minimum and maximum values of the set of unique material properties and by using one or more structure property models.

9. The system as claimed in claim 7, wherein the selection technique is a Decision-Making Algorithm (DMA).

10. The system as claimed in claim 7, wherein the one or more microstructures are obtained and identified as the optimal microstructure when a value of the one or more functional properties and the one or more non-functional properties of one or more components and sub-components of a physical material from the plurality of physical materials is less than or equal to a pre-defined threshold for the input.

11. The system as claimed in claim 7, wherein the one or more microstructures are obtained and identified as the optimal microstructure when a value of the one or more functional properties and the one or more non-functional properties of one or more components and sub-components of a physical material from the plurality of physical materials is greater than or equal to a pre-defined threshold for the input.

12. The system as claimed in claim 7, wherein the one or more microstructures are obtained and identified as the optimal microstructure when a value of the one or more functional properties and the one or more non-functional properties of one or more components and sub-components of a physical material from the plurality of physical materials are between a first pre-defined threshold and a second pre-defined threshold for the input.

13. One or more non-transitory computer readable medium comprising one or more instructions which when executed by one or more hardware processors cause multi-scale material selection for designing mechanical systems by:

receiving, via the one or more hardware processors, an input comprising at least one of a mechanical system problem, a structural design problem, a dynamic problem and a vibrational problem;

computing, via the one or more hardware processors, a set of unique material properties for the input that satisfies one or more problem requirements;

obtaining, via the one or more hardware processors, a range of values specific to the set of unique material properties and a plurality of sizing parameters corresponding to a plurality of physical materials for the input;

selecting, via the one or more hardware processors, at least a subset of (i) the set of unique material properties and (ii) the plurality of sizing parameters of the physical materials that satisfies the problem requirement using a selection technique;

determining (i) one or more functional properties and (ii) one or more non-functional properties of the one or more physical materials based on structure property relationships, wherein the structure property relationships are determined based on one or more analytical and computational models for various composite materials; and identifying for the input, one or more microstructures as one or more optimal microstructures amongst a plurality of microstructures based on the at least of subset of (i) the set of unique material properties and (ii) the plurality of sizing parameters of the physical materials, and the one or more functional properties and the one or more non-functional properties that satisfy the one or more problem requirements.

14. The one or more non-transitory computer readable medium of claim 13, wherein the range of values specific to the one or more properties are obtained based on a calculation of minimum and maximum values of the set of unique material properties and by using one or more structure property models.

15. The one or more non-transitory computer readable medium of claim 13, wherein the selection technique is a Decision-Making Algorithm (DMA).

16. The one or more non-transitory computer readable medium of claim 13, wherein the one or more microstructures are obtained and identified as the optimal microstructure when a value of the one or more functional properties and the one or more non-functional properties of one or more components and sub-components of a physical material from the plurality of physical materials is less than or equal to a pre-defined threshold for the input.

17. The one or more non-transitory computer readable medium of claim 13, wherein the one or more microstructures are obtained and identified as the optimal microstructure when a value of the one or more functional properties and the one or more non-functional properties of one or more components and sub-components of a physical material from the plurality of physical materials is greater than or equal to a pre-defined threshold for the input.

18. The one or more non-transitory computer readable medium of claim 13, wherein the one or more microstructures are obtained and identified as the optimal microstructure when a value of the one or more functional properties and the one or more non-functional properties of one or more components and sub-components of a physical material from the plurality of physical materials are between a first pre-defined threshold and a second pre-defined threshold for the input.

* * * * *